United States Patent [19]

Neidorff

[11] Patent Number: 4,727,264
[45] Date of Patent: Feb. 23, 1988

[54] FAST, LOW-POWER, LOW-DROP DRIVER CIRCUIT

[75] Inventor: Robert A. Neidorff, Milford, N.H.

[73] Assignee: Unitrode Corporation, Lexington, Mass.

[21] Appl. No.: 749,307

[22] Filed: Jun. 27, 1985

[51] Int. Cl.⁴ .............................................. H03K 17/00
[52] U.S. Cl. ..................................... 307/125; 307/106; 307/315; 307/300
[58] Field of Search ................ 307/125, 412, 417, 418, 307/200 R, 239, 240, 241, 242, 139, 140, 315, 300, 552, 553, 562, 253, 254, 267, 268, 273, 106, 255; 328/67

[56] References Cited

U.S. PATENT DOCUMENTS

| | | | |
|---|---|---|---|
| 3,105,158 | 9/1963 | Nichols | 307/300 X |
| 3,534,281 | 10/1970 | Hillhouse | 307/300 X |
| 3,569,742 | 3/1971 | Schroeder | 307/300 X |
| 3,641,369 | 2/1972 | Wallingford | 307/300 X |
| 3,845,405 | 10/1974 | Leidich | 307/300 X |
| 4,028,561 | 6/1977 | Black et al. | 307/300 |
| 4,031,416 | 6/1977 | Peil | 307/315 X |
| 4,164,747 | 8/1979 | Gerstner | 307/315 X |
| 4,426,590 | 1/1984 | Rischmuller | 307/315 X |
| 4,461,960 | 7/1984 | Yasunaga | 307/270 X |
| 4,542,399 | 9/1985 | Monticelli | 307/315 X |

Primary Examiner—William M. Shoop, Jr.
Assistant Examiner—Paul Ip
Attorney, Agent, or Firm—Weingarten, Schurgin, Gagnebin & Hayes

[57] ABSTRACT

A power driver circuit which provides a low voltage drop thereacross when turned on, without being driven into hard saturation. Hard saturation of the circuit according to the present invention is prevented by additional circuit elements which allow the transistor output circuit to be turned on while diverting excess drive current away from the input transistor. As a result, the driver circuit can provide the low saturation voltage and avoid unnecessary saturation of the output transistor while maintaining high-speed switching operation. The circuit may be implemented by discrete components, by a single integrated circuit or part of a larger integrated circuit.

7 Claims, 3 Drawing Figures

FAST, LOW-POWER, LOW-DROP DRIVER CIRCUIT

FIELD OF THE INVENTION

The present invention relates to transistor driver circuits, and in particular, low saturation voltage, high-speed, low-power Darlington driver circuits.

BACKGROUND OF THE INVENTION

Previous driver circuits which provide high-current switching output signals with a low driving signal current typically include two or more transistors in a Darlington-type arrangement. One such arrangement (FIG. 1) includes the collector of the first transistor being returned to the power supply through a current-limiting resistor. The emitter of the first transistor is then received by the base of the subsequent output transistor. The collector of the output transistor is then available to provide the drive current to the particular load circuitry attached thereto. Since the first transistor emitter current is always fixed at its maximum current which is defined by the limiting resistor $R_L$, any current which is received by the second transistor in excess of the amount necessary to provide saturation of the second transistor will cause the second transistor to go further into saturation. As a result, when the circuit is turned off, the output transistor requires a longer turnoff time to deplete the excess charge in the base region. The circuit also consumes more supply current than necessary. When the collectors of the input and output transistors are connected in common (FIG. 2), a classic Darlington pair circuit is formed, which provides a faster switching circuit, with a reduced power supply-current regulation characteristic. However, the circuit exhibits a higher voltage drop and may still be overdriven, resulting in extended turnoff time.

SUMMARAY OF THE INVENTION

The present invention provides a driver circuit providing high-current, low-voltage drop output characteristics with a low-current input drive, having an input transistor, an output transistor, and a regulator transistor. The input transistor operates as an emitter follower, whose output current is received by the output transistor. An additional regulator transistor is also connected to the input transistor, to receive and redirect the input current to the circuit load when the output transistor is saturated. The redirection of the input current therefore prevents the output transistor to become yet further saturated. The circuit therefore maintains the high-current switching capability and the rapid turnoff characteristics without danger of overdrive causing the turnoff time to unnecessarily increase. The circuit also provides low voltage drop without using excessive current. Furthermore, the circuit topology may by integrated to form a single integrated circuit, or become part of a larger integrated circuit.

BRIEF DESCRIPTION OF THE DRAWING

These and other features of the present invention will better understood by reading the following detailed description, taken together with the drawing, and in particular the figures, wherein.

DETAILED DESCRIPTION OF THE INVENTION

Figure 1:
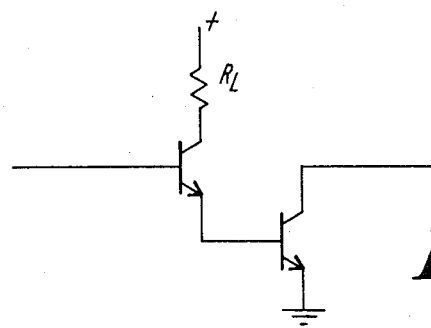
FIGS. 1 and 2 are schematic diagrams of prior art driver circuits.
Figure 2:
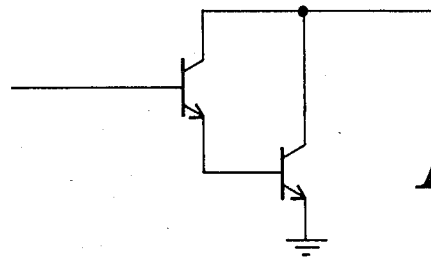
Figure 3:
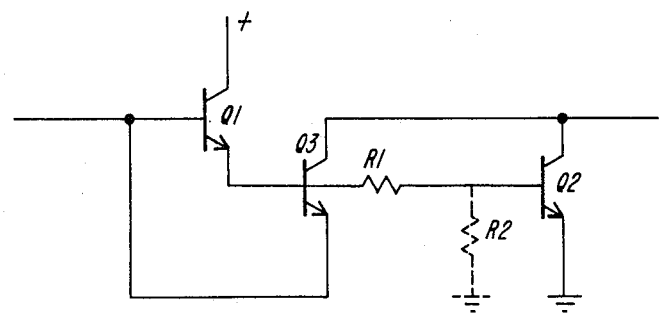
FIG. 3 is a schematic diagram of the topology of one embodiment of the present invention.

Referring now to FIG. 3, the input transistor is Q1, Q2 is the output transistor, and Q3 is the regulating transistor. If transistor Q2, the output transistor, is driven into saturation, Q3 turns on in the reverse active mode, diverting some of the current applied to the base of Q1 directly to the collector load of Q2, thereby diverting the excess base current in the potentially overdriven condition. Resistor R1 is included to allow adjustment of the saturation regulation due to difference in characteristics of transistors Q2 and Q3. Generally, the greater the value of R1 (for a given current through transistor Q2), the more current diverted by the regulator transistor. Ideally, if the turn-on characteristics of transistors Q2 and Q3 are identical, resistor R1 could be eliminated.

In a reverse-active mode, the collector-emitter current flow is controlled by a current flow through the base-collector junction. The collector of the regulator transistor Q3 is connected to the collector of the output transistor Q2, and the regulator transistor Q3 operates in common-base mode, but with the "signal" (the saturation of the outpt transistor Q3) being introduced to the collector of Q3, causing Q3 to turn on. As Q3 turns on, the input current (to Q1) flows directly into the emitter of Q3 to the output load (collector of Q2) and the further saturation of the output transistor Q2 is reduced or eliminated. The saturation of the output transistor Q2 is selectively minimized by matching of the characteristics of Q2 and Q3 and selection of resistor R1 as discussed above.

For instance, with a 1-amp load requirement to the collector of Q2, and a 1-mA input drive signal, a forward beta of 100 and a reverse beta of 5. Since Q2 will sink 1 amp, it will require at least 10 mA of base current drive. Transistor Q2 has 1 mA of base current drive available, so it could source up to 100 mA into the base of Q2. However, any base current in excess of 10 mA to Q2 would be excessive, and would drive transistor Q2 further into saturation, causing it to be slower to turn off. However, when Q2 saturates, Q3 will turn on and remove some of the base current provided by the emitter of Q1, until the system reaches an equilibrium balance. The equilibrium condition, which is achieved, occurs as follows. Transistor Q1 will source 10.2 mA, of which 0.2 mA will go into Q3, and the rest will go into Q2. Rather that wasting about 89.8 times of the input current (to Q1) in excess drive to transistor Q2, the circuit will draw the required current (10 mA) plus 2 percent for Q3. Therefore, since Q2 will not hard-saturate, it will turn off more rapidly. Furthermore, by correctly choosing resistor R1, transistor Q2 can be turned on sufficiently to achieve the desired low saturation voltages.

Alternate embodiments of or substitutions in the present invention are within the scope of the present invention. An optional resistor R2 across the base-emitter junction of the output transistor Q2 may be included for further adjustment of the regulation characteristics and to provide faster switching. The circuit elements can be combined to allow the circuit to be embodied in a low-cost, integrated circuit implementation. Also the input transistor Q1 may be any kind of voltage follower circuit including an FET, Darlington transistor, or other element. Therefore, the present invention is not limited to the above embodiment. Substitutions and modifications made by one skilled in the art are within the scope of the present invention, which is not to be limited except by the claims which follow.

What is claimed is:

1. A driver circuit comprising:
   an input transistor having a first region receiving an input signal, a second region connected to a potential source and a third region providing an output current;
   an output transistor having a base region connected to receive the output current of said input transistor and a collector region connected to an external load; and
   a regulator transistor having a base region connected to the third region of said input transistor, a collector region connected to the collector of said output transistor and an emitter region connected to the first region of said input transistor for diverting the current of said input transistor when said output transistor is in saturation, wherein,
   said potential source is independent of the collector of said output transistor and of a magnitude greater than said collector of said output transistor when in saturation.

2. The driver circuit of claim 1, wherein said input transistor is a bipolar transistor.

3. The driver circuit of claim 1, wherein said regulator transistor comprises a reverse-active bipolar transistor.

4. The driver circuit of claim 1, further comprising:
   a resistor connected to pass the current received by the output transistor therethrough.

5. A driver circuit, comprising:
   a bipolar output transistor providing an output current and receiving an input current; and
   a reverse-active bipolar transistor having at least a base-collector junction, and being connected to said bipolar output transistor for sensing a saturation condition of said output transistor by a current flow through said base-collector junction and for reducing the input current to said output transistor upon saturation of said output transistor, wherein both the emitter and the base of said reverse active transistor are connected to a potential greater than the collector of said output transistor at the onset of saturation of said output transistor.

6. A drive circuit comprising:
   an input transistor operated as a common collector amplifier;
   an output transistor operated as a common emitter amplifier;
   a resistor connecting the emitter of said input transistor to the base of said output transistor; and
   a regulator transistor having a base connected to the emitter of said input transistor, a collector connected to the collector of said output transistor and an emitter connected to the base of said input transistor to provide a path for a selected portion of said input transistor input current in excess of the current necessary to saturate the output, wherein the collector of said input transistor is connected to a potential greater than the potential of said output transistor at the onset of saturation of said output transistor.

7. The driver circuit of claim 6, wherein the resistance of said resistor is increased with the increased level of saturation permitted in the output transistor.

* * * * *